United States Patent [19]

Berger et al.

[11] Patent Number: 5,212,395
[45] Date of Patent: May 18, 1993

[54] P-I-N PHOTODIODES WITH TRANSPARENT CONDUCTIVE CONTACTS

[75] Inventors: Paul R. Berger; Alfred Y. Cho, both of Summit; Niloy K. Dutta, Colonia; John Lopata, North Plainfield; Henry M. O'Bryan, Jr., Plainfield; Deborah L. Sivco, Warren; George J. Zydzik, Columbia, all of N.J.

[73] Assignee: AT&T Bell Laboratories, Murray Hill, N.J.

[21] Appl. No.: 844,264

[22] Filed: Mar. 2, 1992

[51] Int. Cl.$^5$ .................................... H01L 27/14
[52] U.S. Cl. ........................ 257/185; 257/458; 257/449; 257/448; 257/457; 136/256
[58] Field of Search ............... 257/458, 449, 448, 457, 257/185; 136/256

[56] References Cited

U.S. PATENT DOCUMENTS

| | | |
|---|---|---|
| 3,760,240 | 9/1973 | Bergt ..................... 257/449 |
| 4,499,331 | 2/1985 | Hamakawa et al. ............ 257/458 X |
| 4,598,306 | 7/1986 | Nath et al. ............... 257/458 |
| 4,851,658 | 7/1989 | Murata et al. ............. 257/458 X |
| 4,900,370 | 2/1990 | Itoga et al. .............. 136/256 |
| 5,078,803 | 1/1992 | Pier et al. ............... 136/256 |

OTHER PUBLICATIONS

Zirngibl et al., "Characterization of a Top-Illuminated P-I-N Diode with an Indium Tin Oxide Contact", Appl. Phys. Lett. 54(21), 22 May '89, 2076-2078.
Golan et al., "Novel Indium Oxide/N-GaAs Diodes", Appl. Phys. Lett. 57(21), Nov. 19, 1990, pp. 2205-2207.
Lewin et al., "Transparent Conducting Oxides of Metals and Alloys Made by Reactive Magnetron Sputtering from Elemental Targets", Vacuum, vol. 36, No's 1-3, 1986, pp. 95-98.

Primary Examiner—William Mintel
Attorney, Agent, or Firm—Oleg E. Alber

[57] ABSTRACT

This invention pertains to a p-i-n $In_{0.53}Ga_{0.47}As$ photodiode having an optically transparent composite top electrode consisting of a thin semitransparent metal layer from 10 to 40 nm thick and a transparent cadmium tin oxide (CTO) layer from 90 to 600 nm thick. The metal layer makes a non-alloyed ohmic contact to the semiconductor surface, acts as a barrier between the semiconductor and the CTO preventing oxidation of the semiconductor from the $O_2$ in the plasma during reactive magnetron sputtering of the CTO layer, and prevents formation of a p-n junction between the semiconductor and CTO. The CTO functions as the n or p contact, an optical window and an anti-reflection coating. The top electrode also avoids shadowing of the active layer by the top electrode, thus allowing greater collection of incident light. Since the top electrode is non-alloyed, inter-diffusion into the i-region is not relevant, which avoids an increased dark current.

10 Claims, 5 Drawing Sheets

P-I-N PHOTODIODES WITH TRANSPARENT CONDUCTIVE CONTACTS

FIELD OF THE INVENTION

This invention pertains to p-i-n photodiodes with transparent conductive contact.

BACKGROUND OF THE INVENTION

III-V compound semiconductor photodiodes are a key component in optical communications. With continued increased demand for higher data rates, faster photodiodes are required. However, there are two fundamental limits to the speed of a photodiode: (i) the transit time, $t_r$, which is the time to sweep the photogenerated carriers across the p-n junction to be collected by the contact; and (ii) the RC time constant, which is a time associated with the capacitance of the photodiode for the given diode dimensions. Typically the transit time is quite fast, on the order of 5-10 psec, while the RC time constant is usually the limiting factor. To reduce the RC time constant, the photodiode can be made progressively smaller; however, as the photodiode area shrinks, the area available for collecting light diminishes, which in turn significantly reduces the optical signal measured. Since the electrode on the photodiode area shadows a proportionately increasing fraction of the photodiode area, as the device shrinks performance is compromised for smaller photodiodes.

An attempt to reduce the effects of shadowing by the top metal electrode was studied at $\lambda$-0.85 $\mu$m by using indium tin oxide (ITO) as a transparent top electrode in GaAs based photodiodes. See M. Zirngibl et al. "Characterization of a Top-Illuminated p-i-n Diode With an Indium Oxide Tin Contact", *Applied Physics Letters*, Vol. 54, No. 21, 22 May 1989, pages 2076-2078.

However, at higher wavelengths the use of ITO as the top electrode is not appropriate because of its absorption losses. For example, for a range of wavelengths ranging from 1 $\mu$m to 2 $\mu$m the transmission falls off almost linearly from about 87 percent to about 25 percent, respectively. Since attenuation of low loss optical fibers tends to be especially low in the wavelength region between 1.3 and 1.6 microns, there is a need for photodetectors efficient at such wavelengths.

SUMMARY OF THE INVENTION

This invention embodies a compound semiconductor p-i-n photodiode suitable for use in a wavelength region above 1 $\mu$m, especially in the wavelength region between 1.3 and 1.6 $\mu$m. The photodiode is provided with a non-alloyed top electrode including a thin semitransparent metal layer and a layer of transparent cadmium tin oxide (CTO). The top electrode functions as the contact, an optical window and an anti-reflection coating. This electrode also avoids shadowing of the active layer, thus allowing greater collection of incident light. Since the contact is non-alloyed, interdiffusion into the i-region is not relevant and an increased dark current is avoided.

DETAILED DESCRIPTION

This invention is a p-i-n photodiode with a transparent top electrode consisting of a thin semitransparent layer of metal and a layer of transparent cadmium tin oxide (CTO). The thin layer of metal, 5 to 40 nm thick, selected from Ag, Al and In, serves at least these functions: (i) it acts as an intermediary layer which makes a better non-alloyed electrical (ohmic) contact to the semiconductor surface; (ii) it prevents oxidation of the semiconductor underneath the top electrode by the $O_2$ in the plasma during reactive magnetron sputtering of the CTO layer; (iii) it prevents formation of a p-n junction between the top confining layer and/or contact layer and the CTO layer; and (iv) in combination with the CTO layer it eliminates shadowing of the photodiode active layer by the top electrode. The CTO is optically transparent (greater than 80 percent) with a negligible absorption with a conductivity of $2 \times 10^3$ $\Omega^{-1}$ $cm^{-1}$ and resistivity of $5 \times 10^{-4}$ $\Omega cm$ at room temperature. The CTO layer has the following advantages: (i) it can function as either n or p contact; (ii) it acts as an optical window; (iii) it serves as an anti-reflection coating; (iv) it eliminates shadowing of the active layer by the top electrode, thus allowing greater collection of incident light; and (v) since the CTO contact is non-alloyed, inter-diffusion into the i-region is not a factor, which avoids an increased dark current.

Figure 1:
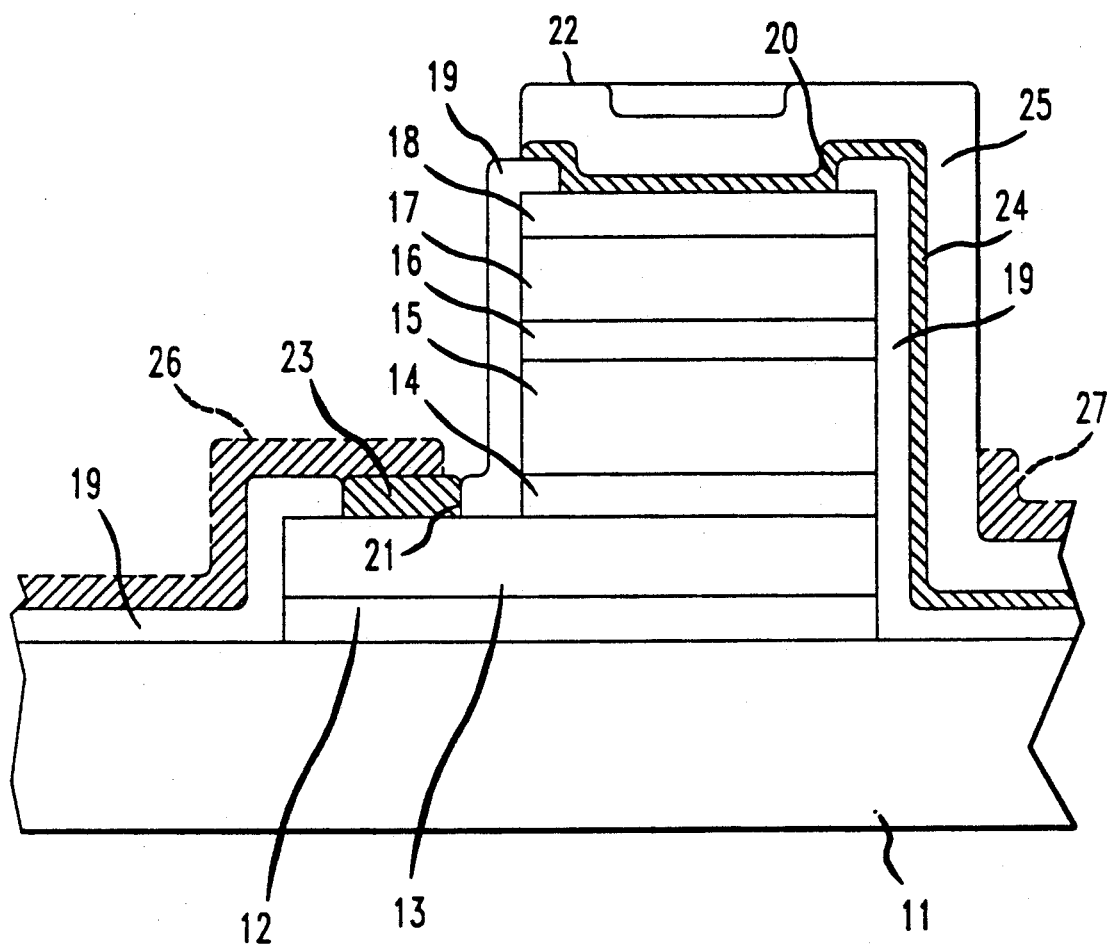
FIG. 1 is a schematic representation of a cross-section of a mesa type version of a p-i-n photodiode according to this invention.

FIG. 1 is a schematic cross-sectional representation of a p-i-n photodiode, 10, according to the invention. For clarity reasons, various elements of the photodiode are not drawn to scale. Photodiode 10 includes a compound semiconductor photodiode structure and electrodes to the structure. The semiconductor material can consist of III-V compound semiconductors which covers the wavelengths 1-2 $\mu$m such as InGaAs/InAlAs, and InGaAsP/InP. The structure includes in an ascending order from a compound semiconductor substrate, 11, a large lower mesa including a super-lattice (SL) buffer layer, 12, and a bottom confining layer, 13, of one type of conductivity, and a smaller upper mesa including a bottom transition layer, 14, an active layer, 15, a top transition layer, 16, a top confining layer, 17, of an opposite conductivity type, and a highly doped contact layer, 18, also of said opposite conductivity type. An insulating layer, 19, overlies the whole of the compound semiconductor structure except for windows, 20, and 21. Window 20 is over an upper surface of contact layer 18, and window 21 is over an upper surface of the lower mesa.

The electrodes include a top electrode, 22, and a lower electrode, 23. The top electrode is a composite of a thin semitransparent layer of metal, 24, and a transparent conductive cadmium tin oxide layer, 25. Thin metal electrode layer, 24, overlies the surface of the insulating layer on top of contact layer 18 and that surface of contact layer which is exposed in window 20, and extends over the insulating layer down to and over an area of the substrate adjacent to the small mesa. A layer of transparent conductive CTO, 25, overlays metal layer 24. The conductive CTO also extends down to and over an area of the substrate adjacent to the small mesa. Lower electrode 23 is in contact with that portion of bottom confining layer 13 which is exposed in window 21. Metal pads, 26, and 27, suitable for probing, are optionally provided in contact with lower electrode 23, and with the transparent oxide layer 25, respectively.

A more detailed construction of p-i-n photodiode 10 is described below. The invention is described with reference to an exemplary $In_xGa_{1-x}As/InP/In_yAl_{1-y}As$ system in which x is 0.53, and y is 0.52.

Substrate 11 is of InP material which may be from 100 μm to 600 μm thick. In this exemplary embodiment, the substrate is semi-insulating. Buffer layer 12, which is typically from 0.1 μm to 0.5 μm thick, is placed to reduce out-diffusion of impurities from the substrate into the upper layers and especially into the active area. Buffer layer 12 is a superlattice which includes from 10 to 30 periods of undoped semiconductor material, each period including a thin layer of InGaAs and a thin layer of InAlAs. In a columnar type configuration of the photodiode, the bottom electrode can be made to the backside of the substrate, in which case substrate 11 and buffer layer 12 would be doped n-type. Confining layers 13 and 17, of n+ and p+ type $In_{0.52}Al_{0.48}As$, respectively, confine the radiation of active layer 15 within the thickness of the active layer. Confining layers are typically deposited in a thickness ranging from 0.1 μm to 0.5 μm, and with a doping concentration of from $5 \times 10^{17}$ to $5 \times 10^{18}$ cm$^{-3}$.

Active layer 15, which is from 0.1 μm to 2.0 μm thick, is of an undoped $In_{0.53}Ga_{0.47}As$. Thin transition layers 14 and 16 of the same material as the confining layers 13 and 17, respectively, but undoped, are positioned on opposite sides of the active layer between the active layer and confining layers 13 and 17, respectively. The transition layers enhance the transition between the relatively highly doped confining layers and the undoped active layer and act as traps for carriers which may migrate from the confining layers to the active layer. Highly doped $In_{0.53}Ga_{0.47}As$ contact layer 18 is provided in a thickness ranging from 0.01 to 0.1 μm to facilitate establishing a non-alloyed ohmic contact between top confining layer 17 and metal layer 24 of the top electrode 22. Typically, the doping concentration of the contact layer ranges from $1 \times 10^{18}$ to $1 \times 10^{19}$ cm$^{-3}$. The contact layer is of the same conductivity type as the top confining layer. Dielectric layer 19, of an insulating material, such as $SiO_2$, $SiN_x$, borosilicate glass, phosphorosilicate glass and other insulating materials inert with respect to the materials of the diode, is deposited in a thickness ranging from 100 nm to 500 nm. The dielectric layer encompasses the two mesas and the remaining surface of the substrate providing insulation and protection from the environment.

Top electrode 22 is formed by first depositing a thin semitransparent metal layer 24 on top of the dielectric layer on top of the smaller mesa and on the top surface of contact layer 18 exposed in window 20, and then depositing a layer 25 of transparent conductive cadmium tin oxide. The metal layer is selected from metals, such as Ag, Al, In, which, when deposited in a thickness of from 5 to 40 nm, are semitransparent to optical radiation and exhibit low absorption to the passage of light. The metal enables formation of a non-alloyed ohmic contact to the contact layer. The metal also acts as a barrier between the semiconductor material of the contact layer and the conductive cadmium tin oxide layer so as to avoid oxidation of the semiconductor surface by $O_2$ during reactive magnetron deposition of CTO and formation of another p-n junction between the p-type compound semiconductor and the oxide layer. Transparent conductive cadmium tin oxide layer 25 is deposited on and is coextensive with metal layer 24. CTO is deposited in a thickness ranging from 90 to 600 nm, preferably 200 to 300 nm. Thicknesses higher than 600 nm or even 500 nm may result in a reduced series resistance but with a decreased transmitivity of optical radiation. CTO in conjunction with the metal layer forms the top electrode with a combined transmitivity as high as 90 percent.

Lower electrode 23 is formed by depositing a thin metal layer in contact with bottom confining layer 13. Preferably, electrode 23 is deposited prior to the deposition of insulating layer 19 which is then patterned to expose electrode 23 in window 21. Typically, electrode 23 is a layer of AuGe alloy from 50 to 200 nm in thickness; however, this layer may be followed by a 20–30 nm thick film of Ni, 20–30 nm thick Ti and 30–200 nm thick Au. Metal pads 26 and 27 may then be optionally deposited in contact with electrode 23 and with CTO layer 25, respectively. These are typically a Ti/Au composite deposited in a total thickness ranging from 50 to 200 nm with Ti being 5–30 nm thick.

The device is produced conveniently by planar technology. This involves first growing on substrate 11 the compound semiconductor structure including layers 12–18 by such known methods as metal organic vapor phase epitaxy (MOVPE), also known as metal organic chemical vapor deposition (MOCVD), or by molecular beam epitaxy (MBE) or by hydride vapor phase epitaxy (VPE). In the preferred embodiment, the semiconductor structure was grown by MBE technology. Thereafter, the formation of the device is continued by defining the mesas. First the active photodiode area is lithographically patterned and the structure is wet chemically etched down to bottom confining layer 13 forming the smaller (active) mesa. Plasma etching could also be used to perform the etching. The structure is patterned again to define the larger diameter isolation mesa and is etched down to the semi-insulating InP substrate. The lower electrode 23 is then added by photolithography and liftoff. After alloying the lower electrode at temperatures ranging from 300° to 450° C. for a period of from 12 minutes to 10 seconds, respectively, the sample is coated with $SiO_2$ by plasma-enhanced chemical vapor deposition (PECVD). The $SiO_2$ is then patterned lithographically to allow windows 20 and 21 to be etched through it to reach the top surface of contact layer 18 of the active mesa and the lower electrode 23, respectively. After etching through the $SiO_2$, the wafer is patterned for liftoff deposition of top electrode 22 atop the active mesa. The patterned wafer is coated with ~10 nm Ag or In by electron beam evaporation and then with 300 nm of CTO deposited by reactive magnetron sputtering, and the metal and CTO are lifted off from areas desired not to be coated by them. After this lift-off, Ti/Au pads, shown in dashed line outlines in FIG. 1, are optionally patterned and deposited.

The growth of the optically transparent CTO layer 25 was conducted using an RF magnetron sputtering system (Anelva Corp., Model SPF-332H). In an exemplary embodiment, the target was a sintered disk (3 inches in diameter, ¼ inch in thickness) of a mixture of about 67 percent CdO and about 33 percent $SnO_2$ (Haselden, San Jose, Calif.). The target was mounted 5 cm above the samples. The plate voltage was 1.5 KV and the plate current approximately 110 mA. A deposition rate of 3 Å/sec was maintained during the growth. The sputtering gas was a mixture of argon and oxygen at a total pressure of from 3 to 4 Pa. The resistivity of cadmium tin oxide (CTO) film depends strongly on the partial pressure of oxygen. Minimum resistivity is obtained for an oxygen partial pressure $P_{O2}$ of about $2-4 \times 10^{-2}$ Pa in 2-4 Pa argon.

Figure 2:
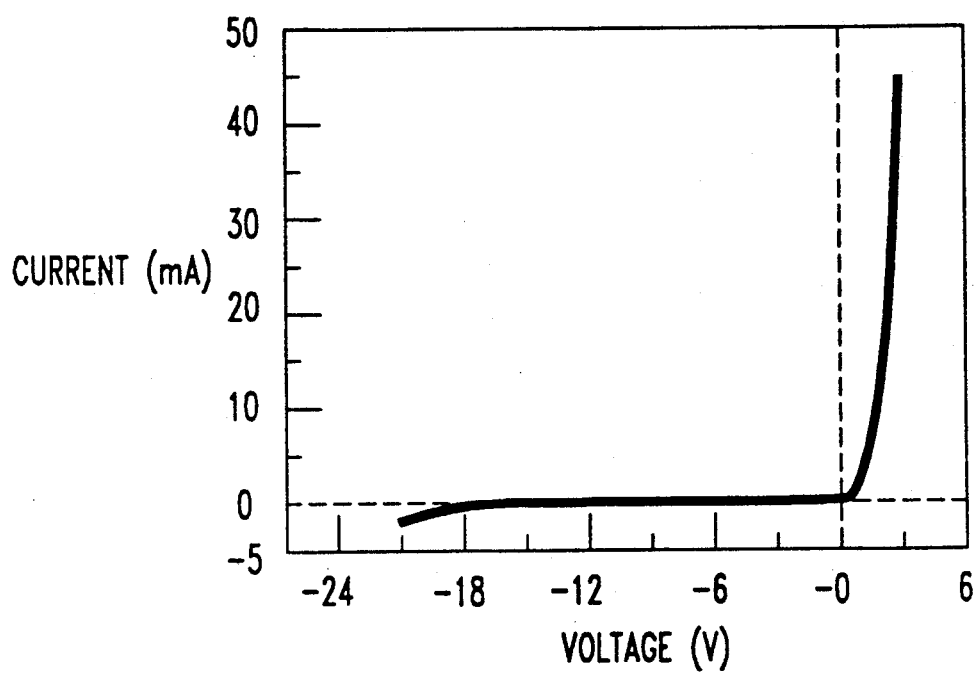
FIG. 2 is a plot of I-V characteristics of the p-i-n photodiode.

A number of so-produced photodiodes was subjected to various tests. I-V characteristics of a 60 μm diameter photodiode were measured and the results are shown in FIG. 2. These photodiodes exhibited leakage currents of $\leq 8$ nA and some as low as 23 pA, and reverse breakdown voltages of $\geq 15$-17 V.

Figure 3:
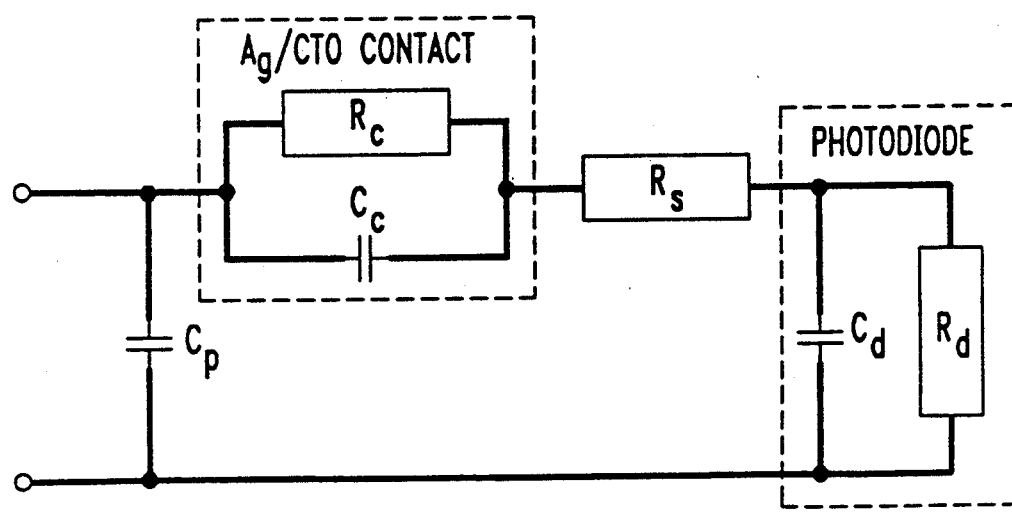
FIG. 3 is a schematic representation of an equivalent circuit used to simulate the zero-bias S parameters measured from the p-i-n photodiode.

The zero bias microwave performance of 9 μm diameter photodiodes was measured with a 100 MHz-40 GHz probe station and an HP 8510 network analyzer. The S-parameters measured were then used to obtain an equivalent circuit by optimizing the π-network shown in FIG. 3. Optimizing the equivalent circuit yielded a device capacitance of 9.3 fF which is close to the calculated 11.6 fF for a 0.75 μm long active region. The series resistance, $R_s$, was around 34.7Ω. The device is expected to be transit time limited, $t_r=7.5$ psec, which corresponds to a $f_{3dB}=85$ GHz.

Figure 4:
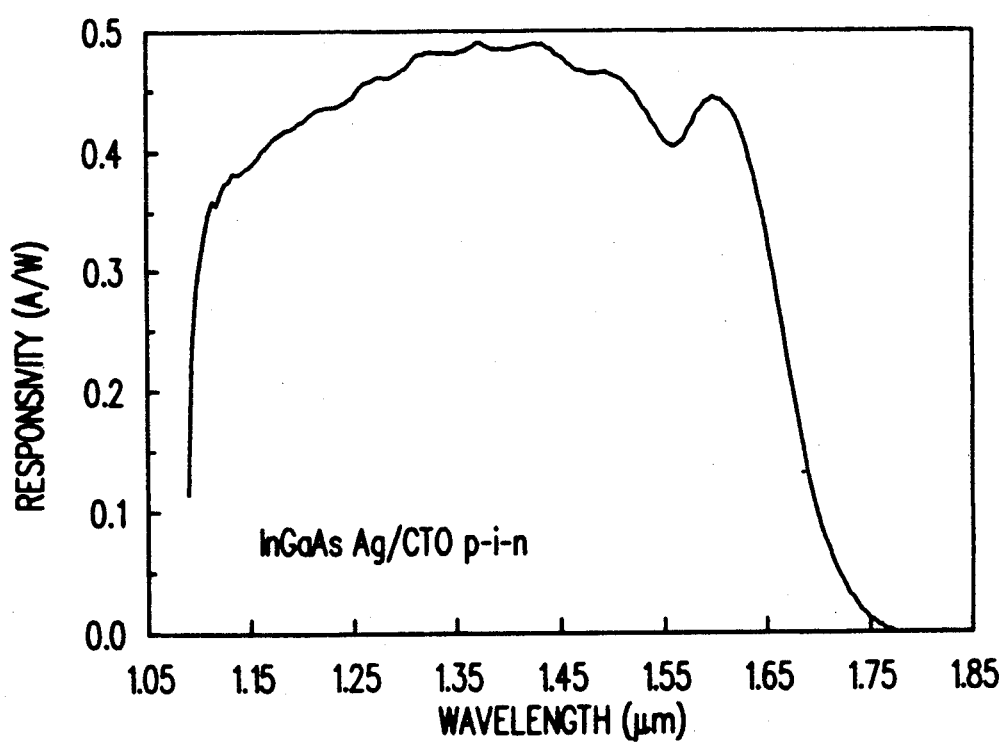
FIG. 4 is a plot of the measured spectral responsivity of an $In_{0.53}Ga_{0.47}As$ p-i-n photodiode according to the invention.

Responsivity was measured using a 1.55 μm wavelength InGaAsP diode laser. Light from this laser was focused onto an unpassivated 60 μm diameter photodiode area. A reverse bias of $-5$ V was applied through coaxial probes, and the photocurrent was measured and compared to a calibrated Ge photoconductor. The responsivity of the p-i-n photodiode at 1.55 μm is at least 0.41 A/W. The spectral dependence of the response was also measured using a white light source and a monochronometer. The spectral response is shown in FIG. 4. The short wavelength cutoff is due to the bandpass filter used to remove spectral harmonics. The spectral dependent response was adjusted to agree with the absolute responsivity measured at 1.55 nm.

Figure 5:
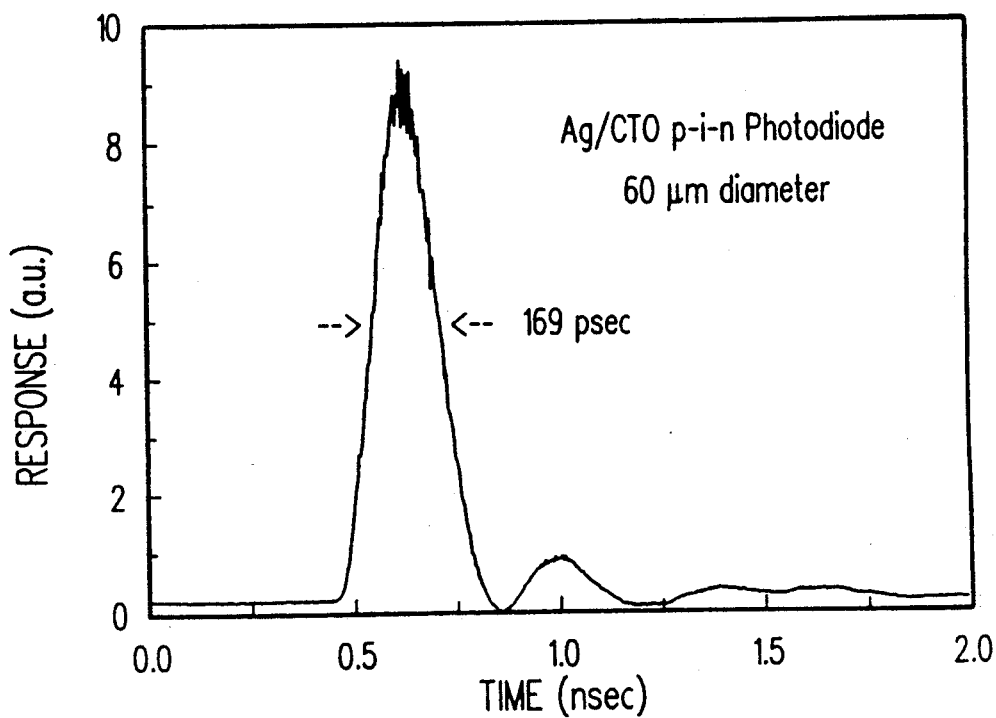
FIG. 5 is a plot of the measured photoresponse of an $In_{0.53}Ga_{0.47}As$ p-i-n photodiode according to this invention to 3 psec pulses from a Nd:YIF laser ($\lambda = 1.047$ $\mu$m) for a 60 $\mu$m diameter top electrode.
Figure 6:
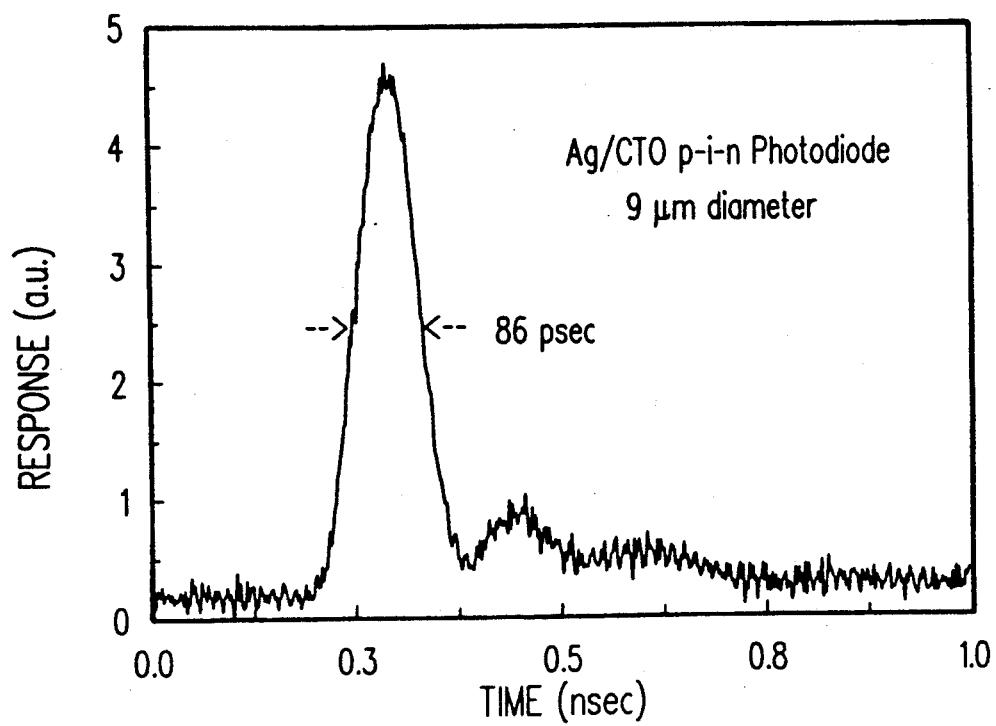
FIG. 6 is a plot of the measured photoresponse of an $In_{0.53}Ga_{0.47}As$ p-i-n photodiode according to this invention to 3 psec pulses from a Nd:YIF laser ($\lambda = 1.047$ $\mu$m) for a 9 $\mu$m diameter top electrode.

The photoresponse of the photodiodes was measured by packaging the devices on a co-planar chip carrier and inserting it into a Design Techniques test fixture. The photodiodes were then illuminated with 3 psec pulses from a passive mode-locked Nd:YIF laser (1.047 μm) pumped with a Ti-sapphire CW laser. The 60 μm diameter photodiodes showed a full width half maximum (FWHM) of 169 psec, shown in FIG. 5, which is slightly higher than an expected maximum of 115 psec. Parasitic capacitances of the top electrode and the doped contact layer with $SiO_2$ sandwiched in-between increased the RC time constant. The 9 μm photodiodes exhibited only a 86 psec FWHM response, shown in FIG. 6, which is much longer than the 20-30 psec expected from, both, calculations of the RC time constant or scaling of the 60 μm diameter device to 9 μm diameter. The response time of the smaller photodiode seems to be limited by the packaging design and the bond wires. This is also confirmed by the contrast to the microwave measurements using on-chip microwave probes which measured low parasitic capacitance compared to the packaged 9 nm photodiodes which exhibit slow photoresponse.

Figure 7:
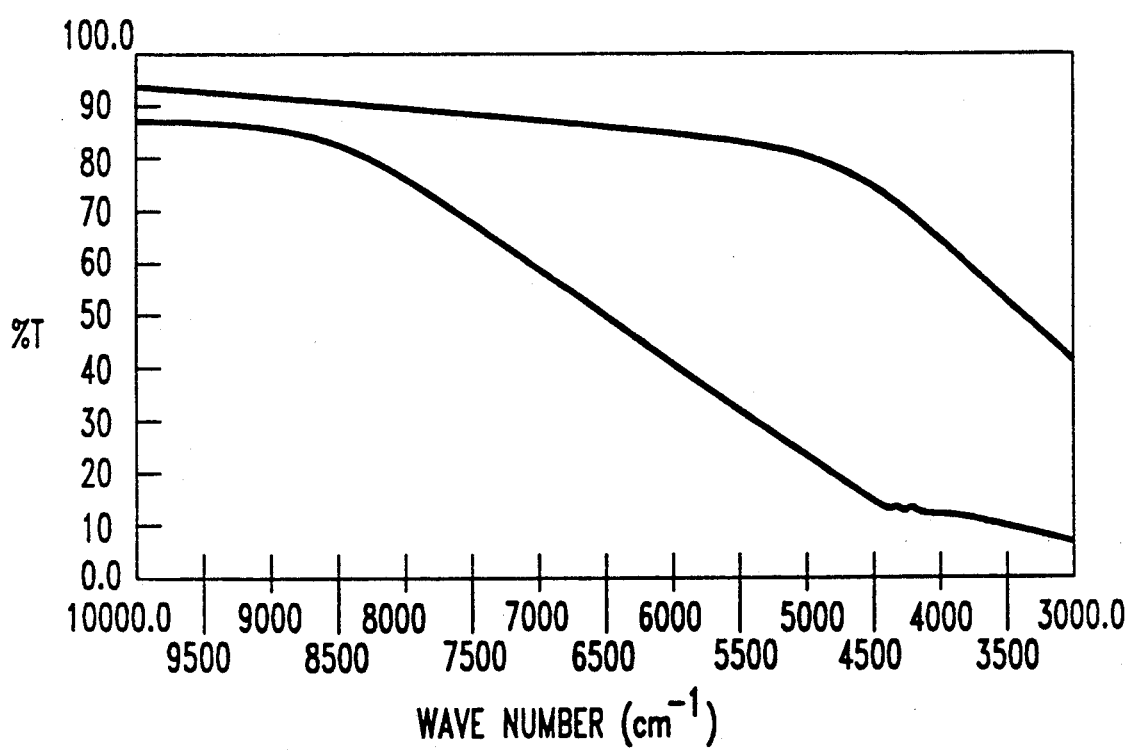
FIG. 7 is a plot of transmitivity versus wave number for CTO (upper curve) and ITO (lower curve).

Transmittance of the CTO was measured for wavelengths from 1 μm to 2 μm (wave numbers of 10,000 to 5000 $cm^{-1}$) and shows a gradually decaying transmittance over the spectral range starting at ~97 percent at 1 μm and falling to ~85 percent at 2 μm. See FIG. 7 (upper curve). For comparison, transmittance of the ITO for wavelengths from 1 μm to 2 μm shows an almost linear decaying transmittance over the spectral range starting at ~87 percent at 1 μm and falling to ~25 percent at 2 μm. See FIG. 7 (lower curve). Transmittance of the Ag and In layers on glass were also measured at the discrete wavelength of 1.55 μm and showed a 97.3 and 98.8 percent transmittance for ~10 nm thick Ag and In, respectively.

The various characteristics of the photodiode according to the invention may be summarized as follows. The photodiodes exhibited leakage currents of $\leq 8$ nA and some as low as 23 pA, with reverse breakdown voltages of $\geq 15$-17 V. Responsivity was measured using a 1.55 μm InGaAsP laser diode focused onto an unpassivated 60 μm diameter top electrode of a p-i-n photodiode and was $\geq 0.41$ A/W. Photoresponse of the diodes to 3 psec pulses from a Nd:YIF laser ($\lambda = 1.047$ μm) was 169 psec and 86 psec for the 60 μm and 9 μm diodes respectively. The frequency response of the 9 μm diode is packaging limited and is expected to have a response time of 20-30 psec.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A p-i-n diode which comprises
    a layered structure of a plurality of compound semiconductor layers, and a lower and a top electrode to the structure,
    said structure comprises a substrate of a first conductivity type, a bottom confining layer of said first conductivity type, an intrinsic active layer, a top confining layer of a second conductivity type, and a contact layer of said second conductivity type, and
    said top electrode is in contact with said contact layer and consists of a thin optically semitransparent metal layer overlaying said contact layer and an optically transparent, conductive cadmium tin oxide layer overlaying said metal layer, said metal layer forming non-alloyed ohmic contact to the contact layer.

2. The p-i-n diode of claim 1, in which the metal of said metal layer is selected from the group consisting of Ag, Al and In.

3. The p-i-n diode of claim 2 in which the thickness of said metal layer falls within a range of from 5 to 40 nm.

4. The p-i-n diode of claim 2, in which said metal layer comprises Ag.

5. The p-i-n diode of claim 4, in which said metal layer is 10 nm thick.

6. The p-i-n diode of claim 1, in which the thickness of said CTO layer falls within a range of from 90 nm to 600 nm.

7. The p-i-n diode of claim 8, in which said CTO layer is 300 nm thick.

8. The p-i-n diode of claim 1, in which said structure includes an undoped InGaAs active layer confined between n+ and p+ type InAlAs layers.

9. The p-i-n diode of claim 8, in which said InGaAs comprises $In_{0.53}Ga_{0.47}As$ and said InAlAs comprises $In_{0.52}Al_{0.48}As$.

10. The p-i-n diode of claim 9, in which a thin transition layer comprising undoped $In_{0.52}Al_{0.48}As$ is positioned between the $In_{0.53}Ga_{0.47}As$ active layer and the respective n+ and p+ type $In_{0.52}Al_{0.48}As$.

* * * * *